(12) United States Patent
Fukui

(10) Patent No.: US 7,557,408 B2
(45) Date of Patent: Jul. 7, 2009

(54) SEMICONDUCTOR DEVICE AND METHOD OF MANUFACTURING THE SAME

(75) Inventor: Takamichi Fukui, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 15 days.

(21) Appl. No.: 11/832,679

(22) Filed: Aug. 2, 2007

(65) Prior Publication Data

US 2008/0029900 A1 Feb. 7, 2008

(30) Foreign Application Priority Data

Aug. 3, 2006 (JP) ............................. 2006-212445

(51) Int. Cl.
*H01L 23/62* (2006.01)

(52) U.S. Cl. ........................................ 257/330; 257/503

(58) Field of Classification Search ................. 257/330, 257/503
See application file for complete search history.

(56) References Cited

FOREIGN PATENT DOCUMENTS

| JP | 05048022 | 2/1993 |
|----|----------|--------|
| JP | 11195704 | 7/1999 |

*Primary Examiner*—Douglas M Menz
(74) *Attorney, Agent, or Firm*—Young & Thompson

(57) ABSTRACT

A semiconductor device has a semiconductor substrate having an impurity-diffused region and a device isolation insulating film formed in the surficial portion thereof, a gate electrode formed on the semiconductor substrate, a contact formed on the gate electrode and connected to the gate electrode, and a protective film disposed between the semiconductor substrate and the gate electrode, below the connecting portion between the gate electrode and the contact, formed wider in width than the gate electrode in a sectional view taken along the direction of gate length of the gate electrode.

14 Claims, 8 Drawing Sheets

SEMICONDUCTOR DEVICE AND METHOD OF MANUFACTURING THE SAME

This application is based on Japanese patent application No. 2006-212445 the content of which is incorporated hereinto by reference.

BACKGROUND

1. Technical Field

The present invention relates to a semiconductor device and a method of manufacturing the same, and more specifically to a semiconductor device containing a gate electrode and a contact connected to the gate electrode.

2. Related Art

Japanese Laid-Open Patent Publication No. H5-48022 describes a configuration in which a common gate electrode is disposed as extending over a P-type diffusion region composing a P-channel MOS transistor and an N-type diffusion region composing an N-channel MOS transistor, wherein the gate electrode is widened in the portion thereof which falls between the P-type diffusion region and the N-type diffusion region, as compared with the portion thereof which falls on these diffusion regions, and a contact connecting the gate electrode and an interconnect formed on the upper layer is provided on the widened portion of the gate electrode.

Japanese Laid-Open Patent Publication No. H11-195704 describes a semiconductor device configured as having a stopper film on a gate electrode, and an insulating interlayer formed further thereon so as to cover the gate electrode. The stopper film is composed of a material showing a larger etching selectivity than the insulating interlayer shows.

FIG. 6 is a plan view showing a configuration of a conventional semiconductor device similar to that described in Japanese Laid-Open Patent Publication No. H5-48022. FIG. 7 and FIG. 8 are an E-F sectional view and a G-H sectional view, respectively, of FIG. 6.

A semiconductor device 10 contains a semiconductor substrate 1, and impurity-diffused regions 2 and device isolation insulating films 4 formed in the surficial portion of the semiconductor substrate 1. The semiconductor device 10 further contains a plurality of gate electrodes 8 extending over the impurity-diffused regions 2 and the device isolation insulating films 4 of the semiconductor substrate 1. Each of the gate electrodes 8 of the semiconductor device 10 contains a pedestal 9 formed wider in width on the device isolation insulating film 4, than on the impurity-diffused regions 2. The semiconductor device 10 still further contains contacts 11 formed on the gate electrodes 8 as being connected to the gate electrodes 8 at the wider portion thereof.

Thus-configured semiconductor device 10 can be formed typically by the procedures below. First, a silicon nitride film or the like is formed over the entire surface of the semiconductor substrate 1 typically by the CVD process. Next, regions of the silicon nitride film, destined for formation of the device isolation insulating films 4, are selectively removed with the aid of a lithographic technique. Next, trenches in which the device isolation insulating films 4 will be formed later are formed in the semiconductor substrate 1 by an etching technique through the silicon nitride film used as a mask. Thereafter, a silicon oxide film is formed over the entire surface of the semiconductor substrate 1 by the CVD process, so as to fill the trenches with the silicon oxide film. Next, portions of the silicon oxide film exposed out into the external are removed by a CMP technique, so as to planarize the surface. Before the trenches are filled up with the silicon oxide film, it is also allowable herein to form a liner film composed of a silicon nitride film or the like on the side walls of the trenches, typically by the thermal oxidation process or the CVD process. The silicon nitride film, used as the mask in the process of forming the trenches, are then removed typically by wet etching.

Next, with the aid of a lithographic technique and an ion implantation technique, ion is introduced into the channel portions and so forth, to thereby form the impurity-diffused regions 2. Next, an electrode material layer for composing the gate electrodes 8 is formed over the entire surface of the semiconductor substrate 1, and the film is then patterned to thereby form the gate electrodes 8. Also the pedestals 9 are formed at the same time. The pedestals 9 are composed of a material same as that composing the gate electrodes 8.

Thereafter, the impurity-diffused regions 2 are further subjected to some processes including ion implantation through the gate electrodes 8 used as a mask. The impurity-diffused regions 2 are then activated by annealing. Transistors are formed as a consequence. An insulating interlayer 12 is then formed over the entire surface of the semiconductor substrate 1. With the aid of a lithographic technique and an etching technique, contact holes are then formed in the insulating interlayer 12. Next, the contact holes are filled up with an electro-conductive material such as tungsten, to thereby form the contacts 11.

Because the gate electrodes 8 have, formed therein, the pedestals 9 widened in width in the connecting portions of the gate electrodes 8 and the contacts 11 as shown in FIG. 6, the surface of the semiconductor substrate 1 can be protected by the pedestals 9 of the gate electrodes 8, when the contact holes are formed in the insulating interlayer 12. The surface of the semiconductor substrate 1 can therefore be prevented from being etched, even for the case where the width of the contacts 11 is larger than that of the gate electrodes 8, or for the case where the pattern should be misaligned.

SUMMARY

However, the conventional solution by widening the gate electrodes in the connecting portions of the gate electrodes and the contacts has inevitably resulted in restrictions on the design basis, adversely affecting improvement in the degree of integration and micronization. In addition, with the configuration of Japanese Laid-Open Patent Publication No. H11-195704, if the contact is formed wider than the gate electrode, there is a danger that the surficial portion of the semiconductor device is etched when forming the contact hole. The present inventors have found these problems.

In one embodiment, there is provided a semiconductor device having transistors formed therein, comprising:

a semiconductor substrate;

a gate electrode formed on the semiconductor substrate;

an insulating interlayer formed on the gate electrode;

a contact formed in the insulating interlayer by filling a contact hole, the bottom of which reaches the gate electrode, with an electro-conductive material, as being connected with the gate electrode; and a protective film disposed between the semiconductor substrate and the gate electrode, below the connecting portion between the gate electrode and the contact, formed wider in width than the gate electrode in a sectional view taken along the direction of gate length of the gate electrode.

In another embodiment, there is provided a method of manufacturing a semiconductor device comprising:

forming, on the entire surface of a semiconductor substrate, a protective film protecting the surface of the semiconductor substrate;

selectively removing the protective film through a mask having a predetermined pattern;

forming, over the entire surface of the semiconductor substrate, an electrode material layer destined for composing a gate electrode;

forming the gate electrode by patterning the electrode material layer;

forming an insulating interlayer over the entire surface of the semiconductor substrate;

forming a contact hole so as to reach the gate electrode, by selectively etching the insulating interlayer; and forming a contact connected to the gate electrode, by filling the contact hole with an electro-conductive material, wherein in the selectively removing the protective film, the mask is configured so as to protect a region below the connecting portion between the contact and the gate electrode, and as being wider in width than the gate electrode, in a sectional view taken along the direction of gate length such that the surface of the semiconductor substrate is protected by the protective film in the forming the contact hole.

The protective film herein protects the surface of the semiconductor substrate by avoiding direct contact between the contact and the semiconductor substrate. The protective film functions also as protecting the surface of the semiconductor substrate, when the contact hole is formed by etching in the insulating interlayer. More specifically, the protective film may be configured using a material showing a larger resistivity against an etching gas used for forming the contact hole in the insulating interlayer, than the semiconductor substrate (device isolation insulating film or impurity-diffused region) shows. The protective film may be configured by using a material different from that composing the surficial portion of the semiconductor substrate below the portions where the contact hole is formed.

According to the semiconductor device and the method of manufacturing the same of the above embodiments, the protective film is formed below the connecting portion of the contact and the gate electrode, and thereby the surface of the semiconductor substrate is protected. Unlike the conventional measures, it is no more necessary now to provide the widened pedestal to the gate electrode. As a consequence, the restrictions on the design basis can be relaxed, allowing improvement in the degree of integration, and micronization.

The present invention can relax restrictions on the design basis possibly arise in the process of forming the contacts to be connected to the gate electrode.

It is to be understood that also any arbitrary combinations of the above-described constituents, and any expressions of the present invention exchanged among the method, the apparatus and so forth are effective as embodiments of the present invention.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
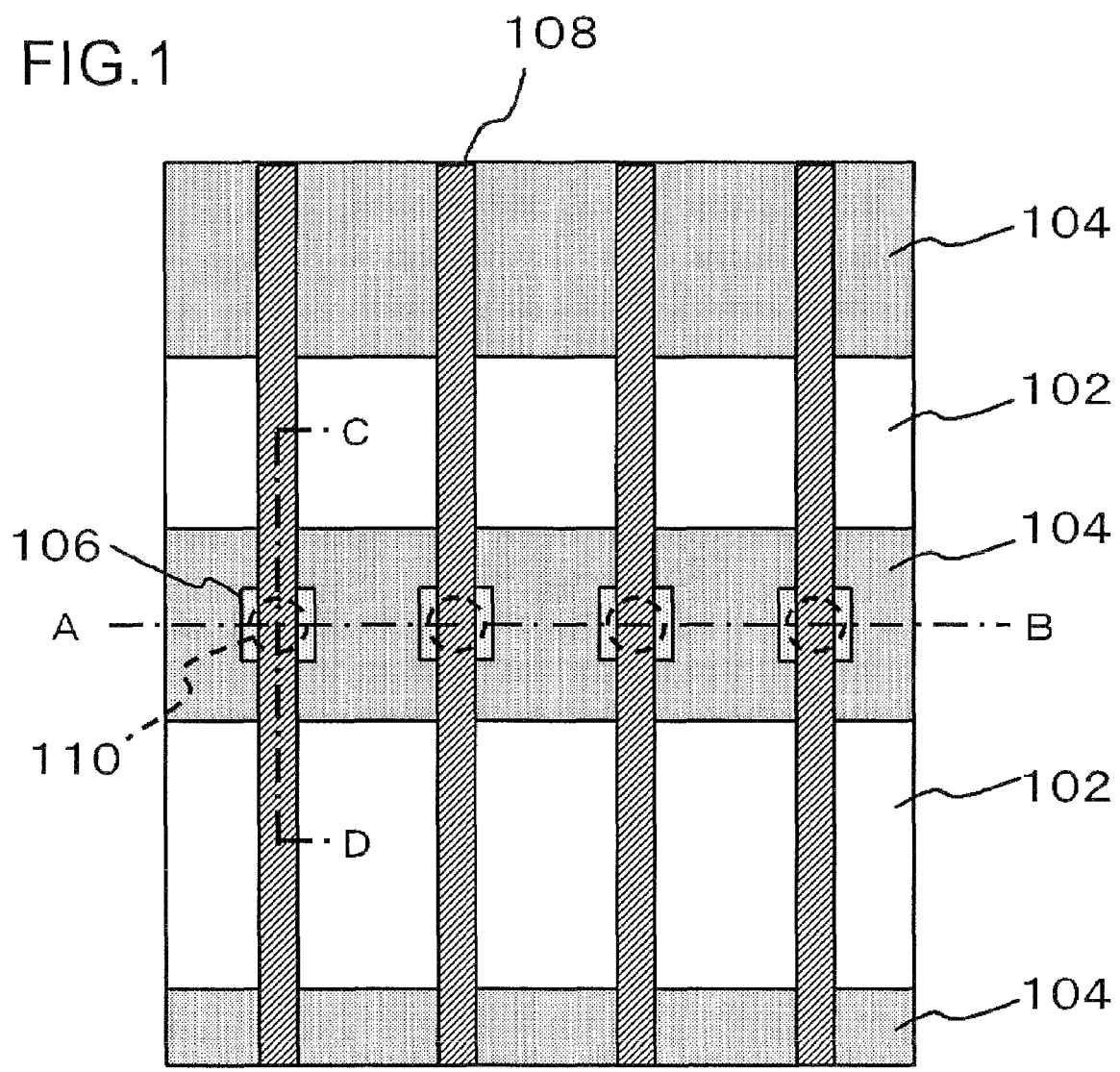
FIG. 1 is a plan view showing a configuration of a semiconductor device according to one embodiment of the present invention.

The invention will be now described herein with reference to an illustrative embodiment. Those skilled in the art will recognize that many alternative embodiments can be accomplished using the teachings of the present invention and that the invention is not limited to the embodiment illustrated for explanatory purposes.

Paragraphs below will explain embodiments of the present invention, referring to the attached drawings. It is to be understood that any similar constituents will be given with similar reference numerals, and detailed explanations therefor will not be repeated.

Figure 2:
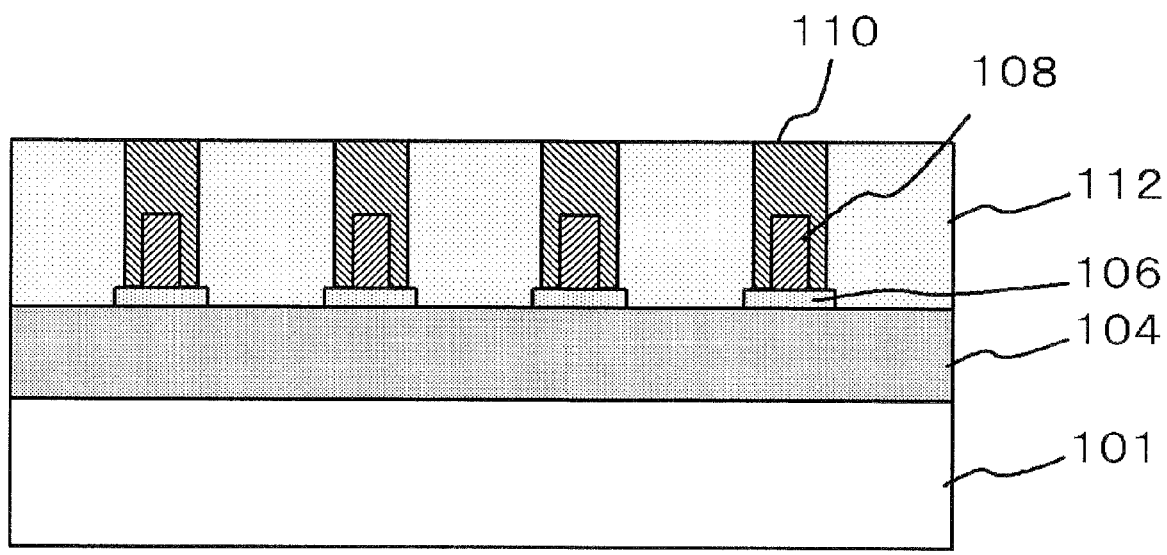
FIG. 2 is an A-B sectional view of FIG. 1.

FIG. 1 is a plan view showing a configuration of a semiconductor device 100 according to this embodiment. FIG. 2 is an A-B sectional view of FIG. 1.

The semiconductor device 100 has a semiconductor substrate 101, impurity-diffused regions 102 and device isolation insulating films 104 (isolation regions) formed in the surficial portion of the semiconductor substrate 101. In the description below, the semiconductor substrate 101 will be defined as including the impurity-diffused regions 102 and the device isolation insulating films 104.

The semiconductor device 100 includes a plurality of gate electrodes 108 formed on the semiconductor substrate 101, an insulating interlayer 112 formed on the gate electrodes 108, and contacts 110 formed on the gate electrode 108 as being connected to the gate electrodes 108. The contacts 110 are formed in the insulating interlayer 112 by filling the contact holes, the bottom of which reaches the gate electrodes 108, with an electro-conductive material.

In this embodiment, the contacts 110 are formed on the device isolation insulating films 104. Each of the gate electrodes 108 contains a portion located on the impurity-diffused region 102, which functions as the gate electrode of the transistor, and a portion located on the device isolation insulating film 104, which functions as the connecting portion with respect to the contact 110. The gate electrode 108 is formed so as to extend unidirectionally, while keeping a constant width, from the portion thereof which functions as the gate electrode to the portion thereof which functions as the connecting portion. Although not being specifically discriminated in FIG. 1, one of two impurity-diffused region 102 partitioned by the device isolation insulating film 104 may be considered as a P-type impurity-diffused region, and the other as an N-type impurity-diffused region, thereby allowing a single gate electrode 108 to configure a P-type MOS transistor and an N-type MOS transistor.

The semiconductor device 100 further contains a protective film 106 disposed between the gate electrodes 108 and the semiconductor substrate 101, below the connecting portion between the gate electrodes 108 and the contacts 110. As shown in FIG. 2, the protective film 106 is formed wider in width than the gate electrode 108 in a sectional view taken along the direction of gate length of the gate electrode 108. FIG. 2 is a sectional view taken along the direction of gate length of the gate electrodes 108. Also the contacts 110 are formed wider in width than the gate electrodes 108 in a sectional view taken along the direction of gate length. The contacts 110 are provided in contact with the protective film 106 beside the gate electrodes 108.

In this embodiment, the device isolation insulating film 104 may be configured typically by using a silicon oxide film. The protective film 106 may be configured using a material different from that composing the device isolation insulating film 104. The protective film 106 may be configured typically by using a silicon nitride film. In this embodiment, the protective film 106 is formed selectively below the connecting portions between the contacts 110 and the gate electrodes 108. For an exemplary case where the protective film 106 is configured using a silicon nitride film, formation of the protective film 106 over the entire surface of the semiconductor substrate 101 may cause warping of wafer, due to stress exerted on the protective film induced by annealing of the like in the later processes. This embodiment, selectively forming the protective film 106, can successfully avoid such warping of wafer.

In this configuration, the surface of the semiconductor substrate 101 is protected by the protective film 106, even when the contact holes are formed by etching the insulating interlayer 112 so as to form, on the gate electrodes 108, the contacts 110 wider in width than the gate electrodes 108, so that the semiconductor substrate 101 (the device isolation insulating film 104 in this embodiment) can successfully be prevented from being etched. The protective film 106 is formed also larger in the in-plane area in the direction than the contacts 110, and protects the surface of the semiconductor substrate 101 in the portion where the contacts 110 are formed. As a consequence, the process margin can be increased.

FIGS. 3A to 3D are process-wise sectional views corresponded to the C-D sectional view of FIG. 1. Procedures of manufacturing the semiconductor device 100 of this embodiment will be explained below, referring to FIGS. 3A to 3D.

Figure 3A:
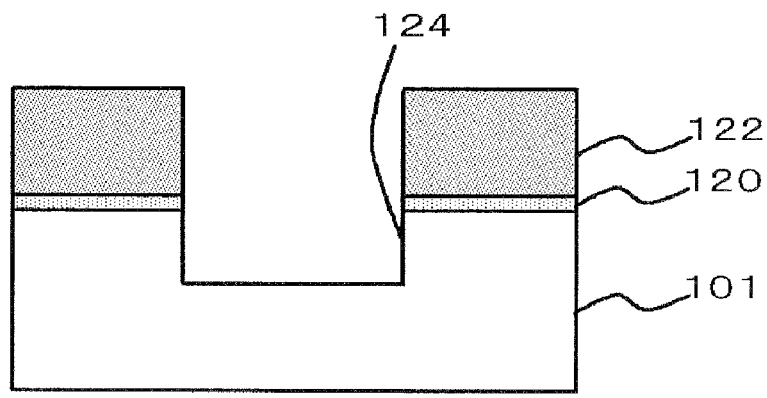
FIGS. 3A to 3D are process-wise sectional views corresponded to the C-D sectional view of FIG. 1.

First, the mask film 120, used for forming the device isolation insulating film 104, is formed over the entire surface of the semiconductor substrate 101 typically by the CVD process. The mask film 120 herein may be composed of a silicon nitride film. Next, a resist film 122 having a predetermined pattern is formed on the mask film 120. The resist film 122 has a pattern having an opening in the region where the device isolation insulating film 104 will be formed later. Next, the mask film 120 is selectively removed through the resist film 122 used as a mask, in the region where the device isolation insulating film 104 will be formed later. Next, a trench 124, in which the device isolation insulating film 104 will be formed later, is formed in the semiconductor substrate 101 by etching the semiconductor substrate 101 (FIG. 3A).

Next, the resist film 122 is removed. Thereafter, a silicon oxide film is formed over the entire surface of the semiconductor substrate 101 typically by the CVD process, to thereby fill up the trench 124 with the silicon oxide film. Next, portions of the silicon oxide film exposed to the external of the trench 124 is then removed and planarized by the CMP technique. By this process, the device isolation insulating film 104 is formed. It is also allowable herein to form, prior to filling-up of the trench 124 with the silicon oxide film, a liner film on the side walls of the trench 124, typically by thermal oxidation, or by using a silicon nitride film or the like formed by the CVD process.

Figure 3B:
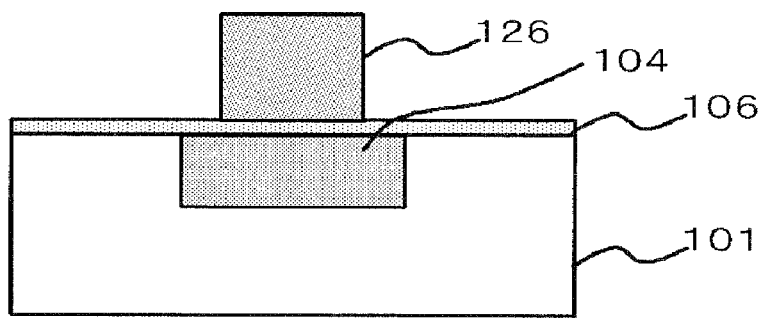

The mask film 120 is then removed by wet etching. The protective film 106 is then formed over the entire surface of the semiconductor substrate 101 by the CVD process. The protective film 106 may be composed of a silicon nitride film. Next, a resist film 126 (mask) having a predetermined pattern is formed on the protective film 106 (FIG. 3B). The resist film 126 is configured so as to protect a region wider in width than the gate electrode 108 in a sectional view taken along the direction of gate length. More specifically, the resist film 126 is configured so as to protect a region larger in the in-plane area than the contact 110, so that the protective film 106 can be formed over the entire range of the region between the contact 110 and the semiconductor substrate 101.

Figure 3C:
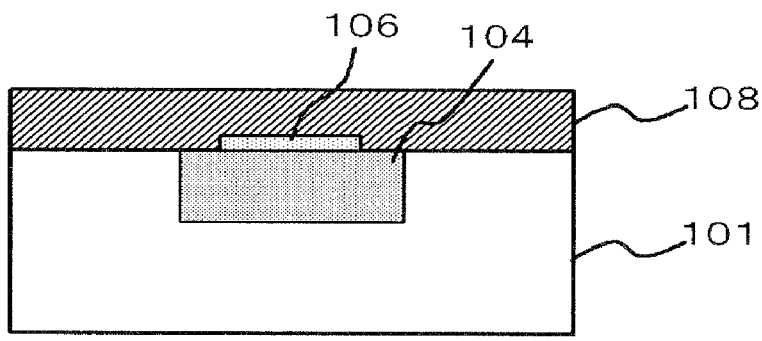

Next, the protective film 106 is selectively removed by etching through the resist film 126 used as a mask. Accordingly, the protective film 106 is selectively formed over the entire range where the contact hole will be formed later. Thereafter, with the aid of a lithographic technique and an ion implantation technique, ion is introduced into the channel portions and so forth, to thereby form impurity-diffused region 102. An electrode material layer composing the gate electrode 108 are then formed over the entire surface of the semiconductor substrate 101, and is patterned to form the gate electrode 108 (FIG. 3C).

Figure 3D:
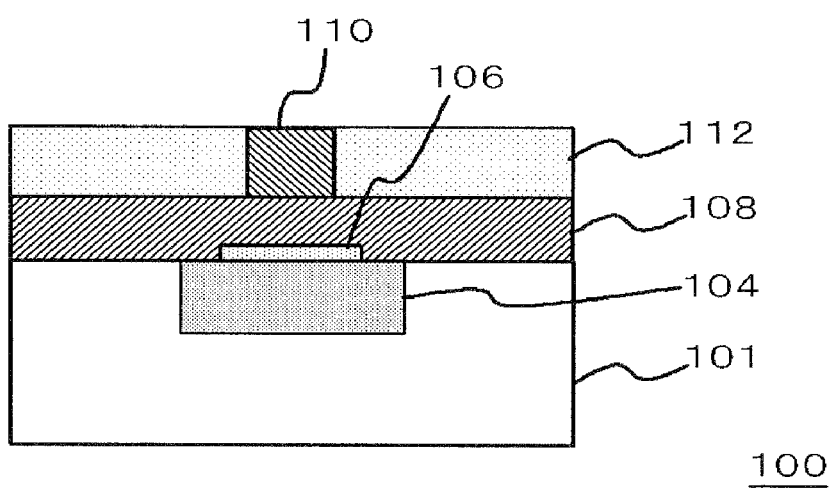

Next, the impurity-diffused region 102 is subjected to ion implantation and so forth through the gate electrodes 108 used as a mask. Next, the impurity-diffused region 102 is activated by annealing. The transistors are thus configured. Thereafter, an insulating interlayer 112 is formed over the entire surface of the semiconductor substrate 101. The contact hole is then formed in the insulating interlayer 112 with the aid of a lithographic technique and an etching technique. Because the protective film 106 in this embodiment is formed as having a larger in-plane area than the contact 110 has, the surface of the semiconductor substrate 101 can be protected during the etching. As a consequence, as shown in FIG. 2, the contact hole can be formed without etching the device isolation insulating film 104 even when the contact 110 is formed wider in width than the gate electrode 108. In other words, in the process of forming the contact hole, the contact hole is formed so as to reach the protective film 106 beside the gate electrode 108. Next, the contact hole is filled up with an electro-conductive material such as tungsten, to thereby form the contact 110 connected to the gate electrode 108 (FIG. 3D).

Figure 4A:
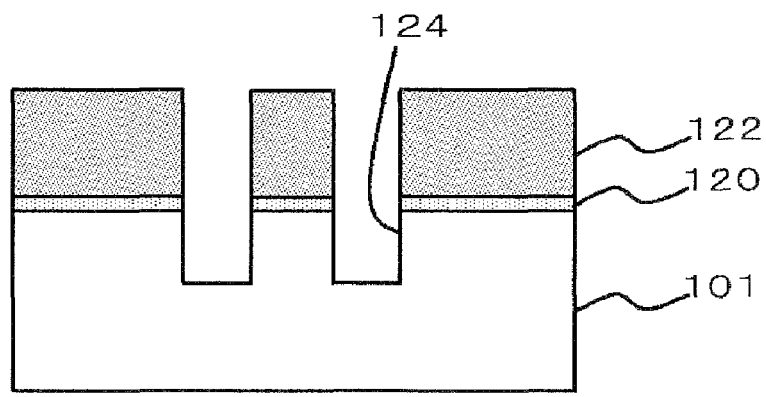
FIGS. 4A to 4D are process-wise sectional views showing another example of the semiconductor device according to one embodiment of the present invention.
Figure 4B:
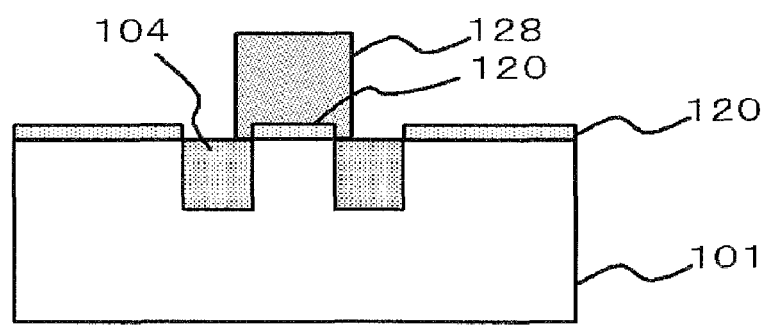
Figure 4C:
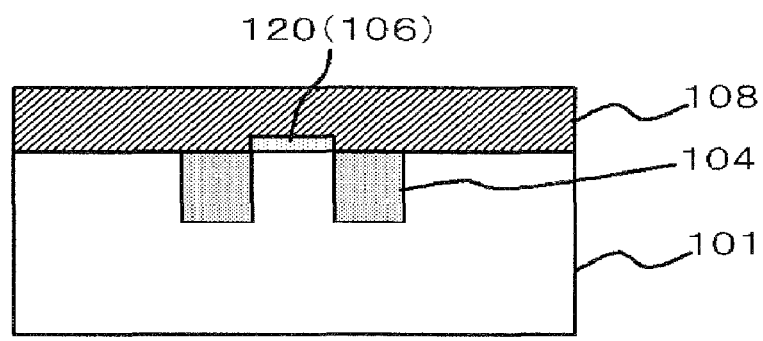

FIGS. 4A to 4C are process-wise sectional views showing another example of a configuration of the semiconductor device 100 of this embodiment.

This configuration differs from the embodiment previously explained referring to FIGS. 1 to 3D, in that the contact 110 is formed on the impurity-diffused region 102 of the semiconductor substrate 101, and that the mask film 120 used for forming the device isolation insulating film 104 is used as the protective film 106. Procedures of manufacturing the semiconductor device 100 of this embodiment will be explained below, referring to FIGS. 4A to 4C. It is to be noted that any similar portions already explained referring to FIGS. 3A to 3D will not repetitively be explained.

First, the mask film 120 and the resist film 122 are formed on the semiconductor substrate 101 in this order. The mask film 120 herein may be composed of a silicon nitride film. Next, the mask film 120 is selectively removed. The semiconductor substrate 101 is then etched through the mask film 120 used as a mask, to thereby form the trench 124 in which the device isolation insulating film 104 will be formed (FIG. 4A).

Next, the resist film 122 is removed. The trench 124 is then filled up with a silicon oxide film. Next, the portion of the silicon oxide film exposed to the external of the trench 124 is removed and planarized by the CMP process. The device isolation insulating film 104 can thus be formed.

Next, a resist film 128 (mask) having a predetermined pattern is formed on the mask film 120 (FIG. 4B). The resist film 128 is configured so as to protect an area wider in width than the gate electrode 108 in a sectional view taken along the direction of gate length of the gate electrode 108. More specifically, the resist film 128 is configured so as to protect a region larger in the in-plane area than the contact 110 has, so that the mask film 120 (protective film 106) can be remained over the entire portion between the contact 110 and the semiconductor substrate 101.

Next, the mask film 120 is selectively removed through the resist film 128 used as a mask. As a consequence, the mask film 120 (protective film 106) is selectively remained over the entire portion where the contact hole will be formed later. Thereafter, the impurity-diffused region 102 and the gate electrode 108 are formed (FIG. 4C).

Figure 4D:
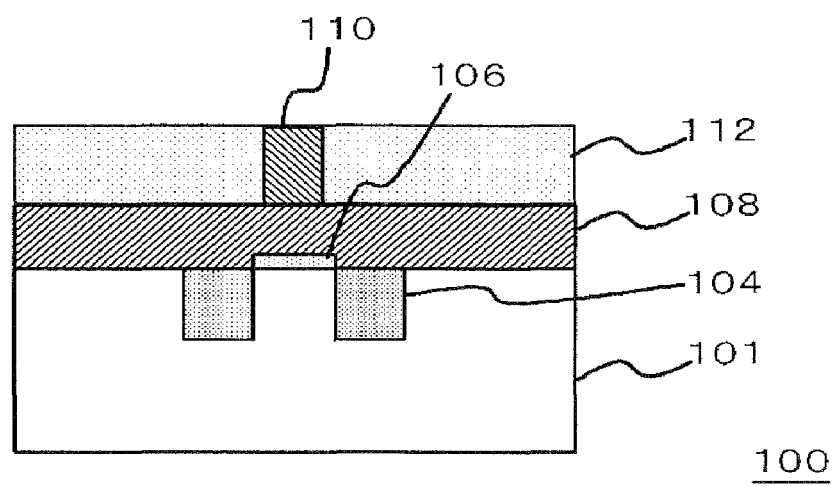
Figure 5:
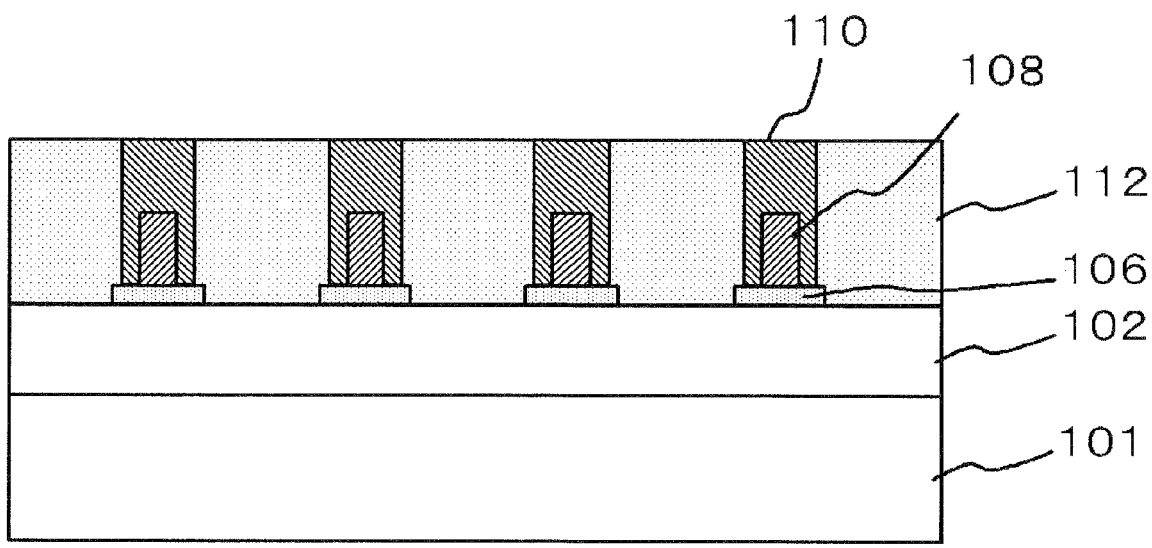
FIG. 5 is a sectional view taken along the direction of gate length of the semiconductor device shown in FIG. 4D.
Figure 6:
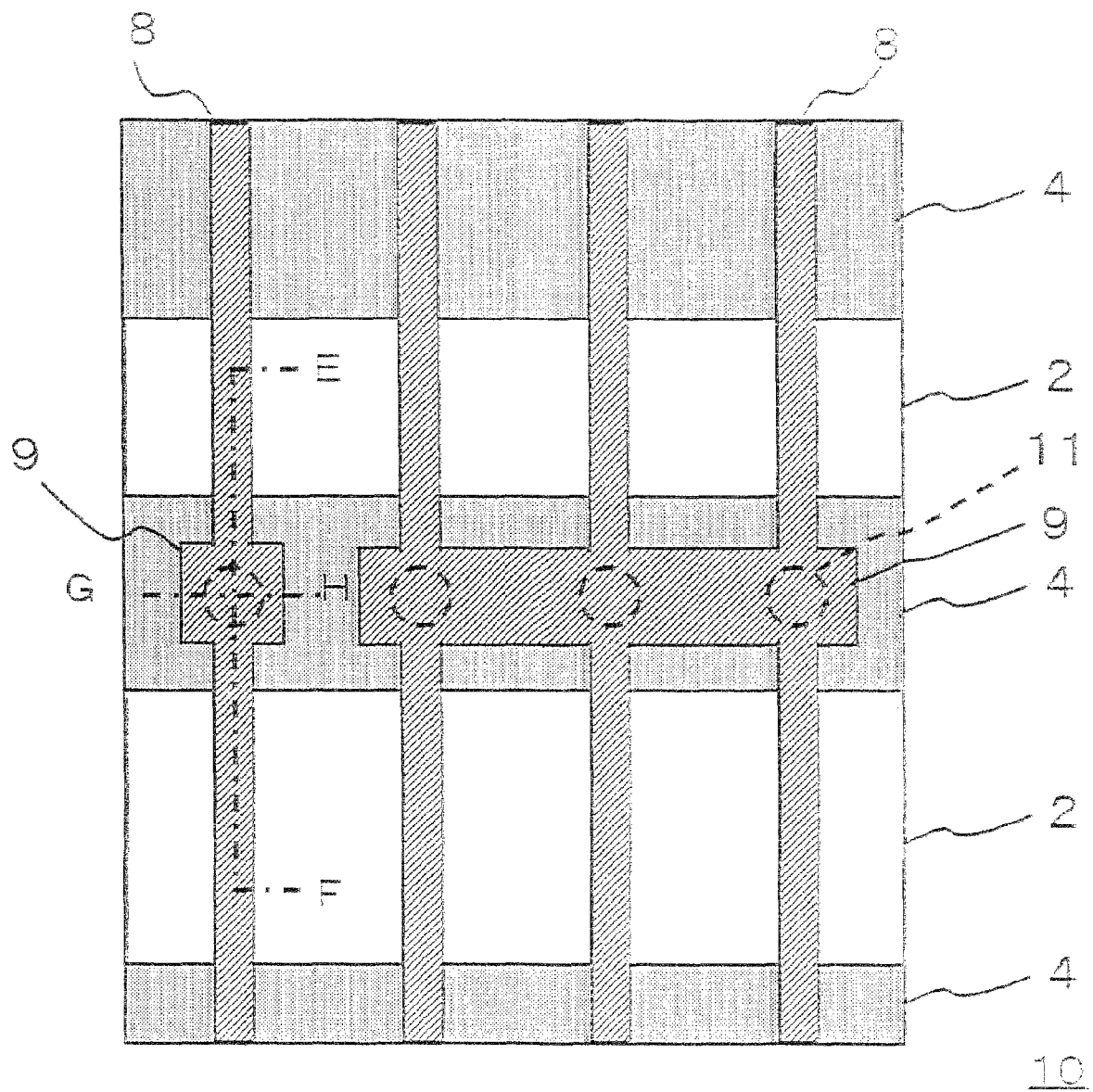
FIG. 6 is a plan view showing a configuration of a conventional semiconductor device.
Figure 7:
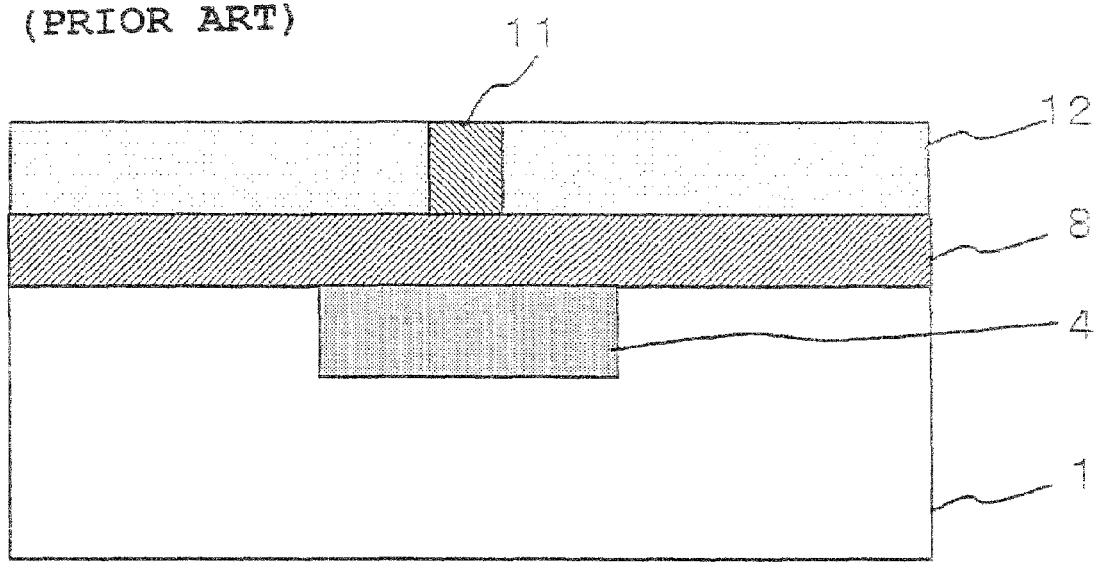
FIG. 7 is an E-F sectional view of FIG. 6.
Figure 8:
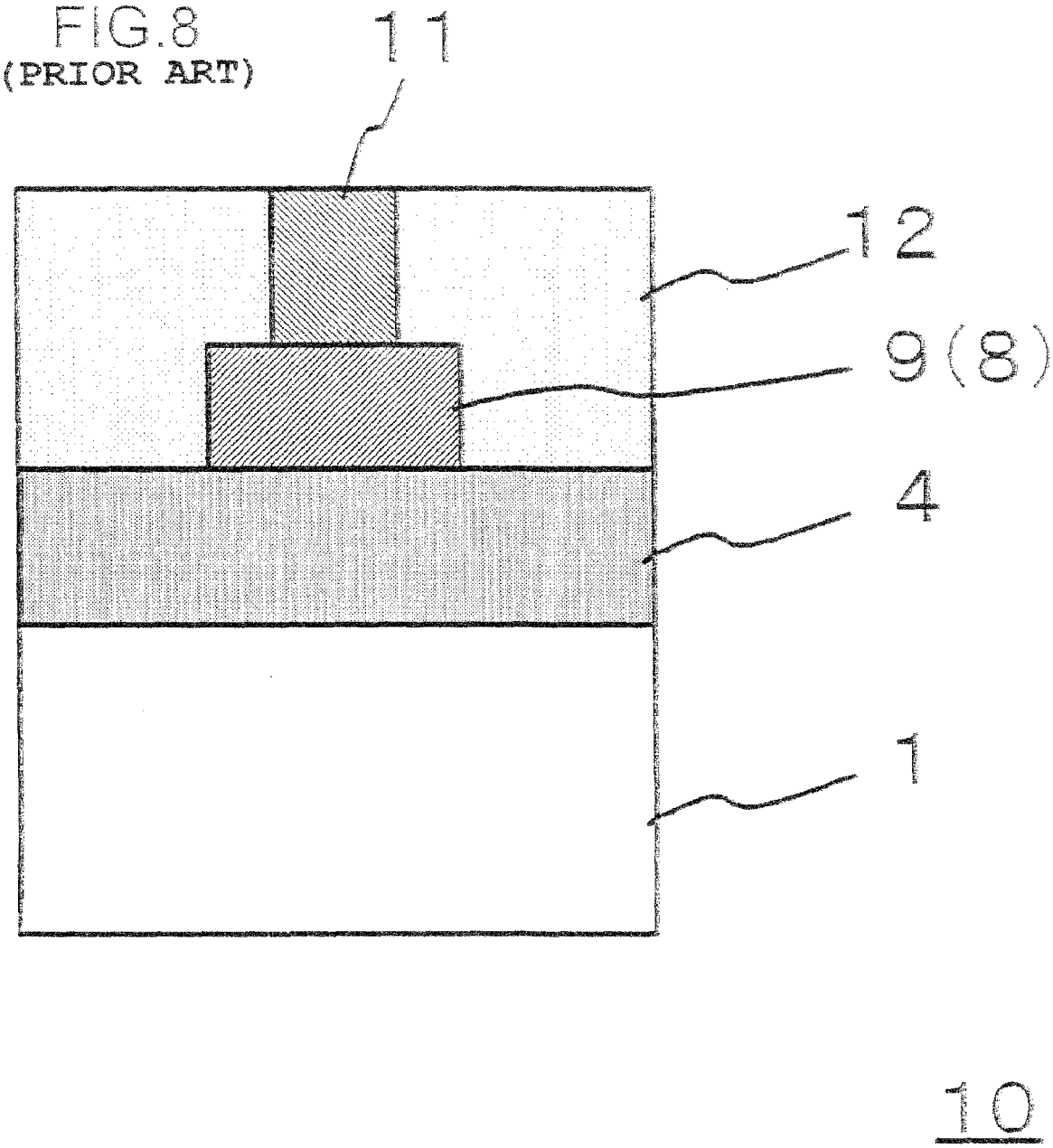
FIG. 8 is a G-H sectional view of FIG. 6.

Next, the ion is implanted into the impurity-diffused region 102 through the gate electrode 108 used as a mask, and thereafter the impurity-diffused region 102 is activated by annealing. Next, the insulating interlayer 112 is formed over the entire surface of the semiconductor substrate 101. The contact hole is then formed in the insulating interlayer 112. FIG. 5 is a sectional view taken along the direction of gate length of the gate electrode 108 of the semiconductor device 100 configured as shown in FIG. 4D. Also in this embodiment, the protective film 106 is formed in the area larger in the in-plane area than the contact 110 has, so that the surface of the semiconductor substrate 101 can be protected during the etching. As a consequence, as shown in FIG. 5, the contact hole can be formed without etching the impurity-diffused region 102, even for the case where the contact 110 is formed wider than the gate electrode 108. In other words, in the process of forming the contact hole, the contact hole is formed so as to reach the protective film 106 beside the gate electrode 108. Next, the contact hole is filled up with an electro-conductive material such as tungsten, to thereby form the contact 110 connected to the gate electrode 108 (FIG. 4D).

As has been described in the above, according to the semiconductor device 100 of this embodiment, the gate electrode 108 no more necessarily has any pedestal formed wider than other region, thereby relaxing restrictions on the design basis, and allowing micronization.

The embodiments of the present invention have been described in the above referring to the attached drawings, merely for exemplary purposes, allowing adoption of any other various configurations other than those described in the above.

The configuration of the present invention explained in the above may be combined with the configuration having a stopper film formed on the gate electrode, as described in Japanese Laid-Open Patent Publication No. H11-195704.

It is apparent that the present invention is not limited to the above embodiment, that may be modified and changed without departing from the scope and spirit of the invention.

What is claimed is:

1. A semiconductor device having transistors formed therein, comprising:
   a semiconductor substrate;
   a gate electrode formed on said semiconductor substrate;
   an insulating interlayer formed on said gate electrode;
   a contact formed of an electro-conductive material filling a contact hole in said insulating interlayer, a bottom of said contact reaching said gate electrode, said contact being connected with said gate electrode; and
   a protective film partially surrounded by said insulating interlayer and disposed between said semiconductor substrate and said gate electrode and below the connecting portion between said gate electrode and said contact, said protective film formed wider in width than said gate electrode in a sectional view across a direction of gate length of said gate electrode.

2. The semiconductor device as claimed in claim 1, further comprising:
   an impurity-diffused region; and
   an isolation region having a device isolation insulating film formed therein,
   said impurity-diffused region and said isolation region formed in a surficial portion of said semiconductor substrate,
   wherein said gate electrode comprises a first portion configured to function as a gate electrode of said transistor, and a second portion configured to function as a connecting portion to said contact, and
   wherein said gate electrode extends unidirectionally with a constant width from said first portion to said second portion.

3. The semiconductor device as claimed in claim 2,
   wherein said contact is formed on said isolation region, and
   wherein said protective film is selectively formed on said isolation region, said protective film and said device isolation insulating film being composed of different materials.

4. The semiconductor device as claimed in claim 1,
   wherein said contact is formed wider in width than said gate electrode in a sectional view along the direction of gate length, and
   wherein said contact is in contact with said protective film beside said gate electrode.

5. The semiconductor device as claimed in claim 1,
   wherein said protective film is composed of a silicon nitride film.

6. The semiconductor device as claimed in claim 1, further comprising:
   an impurity-diffused region; and
   an isolation region having a device isolation insulating film formed therein,
   said impurity-diffused region and said isolation region formed in a surficial portion of said semiconductor substrate,
   wherein said protective film is configured to protect said device isolation insulating film when said contact hole is formed in said insulating interlayer.

7. A semiconductor device having transistors formed therein, comprising:
   a semiconductor substrate;
   a gate electrode formed on said semiconductor substrate;
   an insulating interlayer formed on said gate electrode;
   a contact formed of an electro-conductive material filling a contact hole in said insulating interlayer a bottom of said contact reaching said gate electrode, said contact being connected with said gate electrode;
   a protective film disposed between said semiconductor substrate and said gate electrode and below the connecting portion between said gate electrode and said contact, said protective film formed wider in width than said gate electrode in a sectional view across a direction of gate length of said gate electrode;
   an impurity-diffused region; and
   an isolation region having a device isolation insulating film formed therein,
   wherein said impurity-diffused region and said isolation region are formed in a surficial portion of said semiconductor substrate,
   wherein said gate electrode comprises a first portion configured to function as a gate electrode of said transistor, and a second portion configured to function as a connecting portion to said contact, wherein said gate electrode extends unidirectionally with a constant width from said first portion to said second portion, wherein said contact is formed on said isolation region, and wherein said protective film is selectively formed on said isolation region, said protective film and said device isolation insulating film being composed of different materials.

8. The semiconductor device as claimed in claim 7, wherein said contact is formed wider in width than said gate electrode in a sectional view along the direction of gate length, and wherein said contact is in contact with said protective film beside said gate electrode.

9. The semiconductor device as claimed in claim 7, wherein said protective film is composed of a silicon nitride film.

10. The semiconductor device as claimed in claim 7, wherein said protective film is configured to protect said device isolation insulating film when said contact hole is formed in said insulating interlayer.

11. A semiconductor device having transistors formed therein, comprising:

a semiconductor substrate;

a gate electrode formed on said semiconductor substrate;

an insulating interlayer formed on said gate electrode;

a contact formed of an electro-conductive material filling a contact hole in said insulating interlayer a bottom of said contact reaching said gate electrode, said contact being connected with said gate electrode;

a protective film disposed between said semiconductor substrate and said gate electrode and below the connecting portion between said gate electrode and said contact, said protective film formed wider in width than said gate electrode in a sectional view across a direction of gate length of said gate electrode, wherein said contact is formed wider in width than said gate electrode in a sectional view along the direction of gate length, and wherein said contact is in contact with said protective film beside said gate electrode.

12. The semiconductor device as claimed in claim 11, further comprising:

an impurity-diffused region; and an isolation region having a device isolation insulating film formed therein, said impurity-diffused region and said isolation region formed in a surficial portion of said semiconductor substrate, wherein said gate electrode comprises a first portion configured to function as a gate electrode of said transistor, and a second portion configured to function as a connecting portion to said contact, and wherein said gate electrode extends unidirectionally with a constant width from said first portion to said second portion.

13. The semiconductor device as claimed in claim 11, wherein said protective film is composed of a silicon nitride film.

14. The semiconductor device as claimed in claim 11, further comprising:

an impurity-diffused region; and an isolation region having a device isolation insulating film formed therein, said impurity-diffused region and said isolation region formed in a surficial portion of said semiconductor substrate, wherein said protective film is configured to protect said device isolation insulating film when said contact hole is formed in said insulating interlayer.

* * * * *